United States Patent [19]
Rudigier et al.

[11] Patent Number: 5,667,700
[45] Date of Patent: Sep. 16, 1997

[54] PROCESS FOR THE FABRICATION OF A STRUCTURAL AND OPTICAL ELEMENT

[75] Inventors: Helmut Rudigier, Bad Ragaz, Switzerland; Johannes Edlinger, Feldkirch, Austria

[73] Assignee: Balzers Aktiengesellschaft, Furstentum, Liechtenstein

[21] Appl. No.: 196,766

[22] Filed: Feb. 14, 1994

Related U.S. Application Data

[62] Division of Ser. No. 970,080, Nov. 2, 1992, abandoned.

[30] Foreign Application Priority Data

Jul. 21, 1992 [CH] Switzerland .............. 2292/92

[51] Int. Cl.$^6$ .............. B05D 5/00
[52] U.S. Cl. .............. 216/12; 216/58; 216/60; 216/67; 216/72; 216/76; 216/65; 216/66
[58] Field of Search .............. 359/580; 430/9, 430/11, 14, 15, 321, 5

[56] References Cited

U.S. PATENT DOCUMENTS

| | | | |
|---|---|---|---|
| 3,880,684 | 4/1975 | Abe | 156/646 |
| 4,141,621 | 2/1979 | Aagard et al. | 156/643 X |
| 4,431,695 | 2/1984 | Flatscher | 430/5 |
| 4,534,620 | 8/1985 | Gale et al. | 350/166 |
| 4,569,717 | 2/1986 | Ohgami et al. | 156/626 |
| 4,684,436 | 8/1987 | Burns et al. | 430/318 |
| 4,780,175 | 10/1988 | Taneya et al. | 156/657 X |
| 4,923,772 | 5/1990 | Kirch et al. | 430/323 |
| 5,074,456 | 12/1991 | Degner et al. | 156/345 X |
| 5,246,529 | 9/1993 | Fukasawa et al. | 156/643 |
| 5,252,516 | 10/1993 | Nguyen et al. | 437/195 |
| 5,254,202 | 10/1993 | Kaplan | 156/667 X |
| 5,298,351 | 3/1994 | Bobroff et al. | 156/643 X |

FOREIGN PATENT DOCUMENTS

| | | | |
|---|---|---|---|
| 0049799 | 4/1982 | European Pat. Off. | G03F 1/00 |
| 0265658 | 4/1988 | European Pat. Off. | G03F 1/00 |
| 0463319 | 2/1992 | European Pat. Off. | G03F 1/14 |
| 9101514 | 2/1991 | WIPO | G03F 7/20 |

OTHER PUBLICATIONS

J.P. Lehan et al., Optical and Microstructural Properties of Hafnium Dioxide Thin Films, Elsevier Sequoia (1991).

*Primary Examiner*—Thi Dang
*Attorney, Agent, or Firm*—Notaro & Michalos P.C.

[57] ABSTRACT

A process for the fabrication of a structural element, in particular an optical element comprises a carrier substrate as well as a layer system, with at least one dielectric layer stepped with respect to its thickness in at least one region opposite at least one second region. The dielectric layer is of the type $MeO_x$ and is applied onto a base, where Me is a metal whose atomic mass is at least 44, and x is selected so that the coefficient of absorption of the layer material at light of wavelength $\lambda=308$ nm is $k_{308} \leq 0.01$. The layer is built up through reactive etching by means of an activated gas for the step formation of the thickness. Other related processes and examples of the elements themselves are also disclosed.

37 Claims, 4 Drawing Sheets

PROCESS FOR THE FABRICATION OF A STRUCTURAL AND OPTICAL ELEMENT

This application is a division of application Ser. No. 07/970,080, filed Nov. 2, 1992, now abandoned.

FIELD AND BACKGROUND OF THE INVENTION

The present invention relates to:
a) a process for the fabrication of a structural element, in particular, an optical structural element;
b) various types of optical elements;
c) an optical imaging system;
d) a vacuum treatment installation for the fabrication of an optical element;
e) a process for tracking the erosion of material or the deposition of material;
f) an installation for such tracking;
g) a process for determining the point at which a surface has been reached during a reactive etching operation;
h) an etching process control method; and
i) a stop layer for an etching process.

Although the process according to a), and, consequently, also the vacuum treatment installation according to d), are suitable for the fabrication of a broad spectrum of structural elements each comprising a carrier substrate as well as at least one dielectric layer which, at at least one area, is to be eroded down to a given thickness, the gist or essence of the present invention is that it responds essentially to the requirements of semiconductor fabrication technology.

The structuring of dielectric layers, like structuring of metallic layers, is an essential process step in semiconductor technology. For the removal of dielectric layers of this type various methods have been used.

A first method, known as the lift-off technique, comprises the application of a photosensitive material, such as photoresist, to the substrate, exposing the material or resist to a desired pattern, developing the resist and then cleaning it. Depending on whether or not a positive or a negative resist has been used, the non-exposed or the exposed areas of the resist remain. A layer system is applied onto the substrate treated in this way, and subsequently the photosensitive resist disposed under the layers is dissolved by using an appropriate solvent. In this way, the layer system is removed in those regions of the substrate where the resist was remained. It is essential that the layer system does not impermeably close off the resist against the outside, especially at the edges of the region, in order not to preclude penetration by the solvent.

A second method comprises first applying the layer system onto the substrate. Subsequently the photosensitive resist is applied, exposed to the desired pattern, and developed. The layer system is thereby exposed at those sites or areas at which partial removal or removal down to the substrate is to take place. The latter takes place through bombardment by means of noble gas ions at typical energy values of 1000 eV and a typical ion current density of approximately 1 mA/cm$^2$. The layer material is thereby etched away as well as the photosensitive resist. Since the etching rate of the resist is, in general, higher than that of the layer system, a thick resist has to be applied. This is done in order to prevent the resist from being etched away before the sites which are not covered by resist are removed down to the desired depth.

This process is also referred to as "ion milling" and is not selective in the sense that the etching rates for layer materials of the same type, such as for example of metal oxides, are not significantly different. An advantage of this ion milling method consequently resides in that it is not a process specific to the material to be etched.

A third method is reactive etching (RE). Departing from a layer system using a mask, for example made of a photosensitive resist as in ion milling, a gas is activated selectively, depending on the layer material to be removed, in the sense that reactive gas particles are generated which convert the layer material, which through the mask is exposed at particular sites, into volatile reaction products which are subsequently pumped off. In this way the layer system is removed or eroded. Through a suitable selection of the activated gas, called in the following a "reactive gas", it can be achieved that only a particular material is selectively and considerable etched whereby a high selectivity is achieved. By choosing a high selectivity with respect to the mask material, for example with respect to a photosensitive resist, only a thin layer of it need be applied. Also, the etching rates which can be achieved in reactive etching are be greater by decades than the rates achieved by ion milling. Consequently, this third method is in general economically more advantageous than is the ion milling process.

Activation of the reactive gas can take place in different ways, for example directly on the surface to be removed through laser beam bombardment or spatially distributed through laser beam effect, microwave energy or through ion or electron beams. Subsequently, the reactive gas activation can take place in a glow discharge whereby reactive species are formed.

While reactive etching through local laser effect can lead to high thermal loading of the layer system, those processes in which over the layer surface to be eroded an homogeneous density distribution of the reactive gas species is achieved, as is the case especially by means of a glow discharge, have the further essential advantage compared to the ion milling process that the edge profiles of the etched surface areas can be controlled better in the sense that practically ideal vertical steps can be achieved in the structure, if desired.

It is known from U.S. Pat. No. 4,684,436, to apply a pattern by means of a laser ablation process onto the surface of a work piece, there the intensity of a laser beam use during the process is modulated by means of a mask with a locally different layer system. The mask comprises a dielectric layer system on which, for achieving different energy transmission values through the above stated ion milling process, regions are etched to a greater or lesser depth or a number of the provided layers is selectively etched off. With respect to the layer stack structures of a mask of this type, which structures, as will become evident, can also be realized according to the present invention, U.S. Pat. No. 4,684,436 is incorporated here by reference.

It is further known from U.S. Pat. No. 4,923,772, to use excimer lasers for laser ablation processes, for example operating at a wavelength of 248 nm and wherein for the ablation process energy densities >100 mJ/cm$^2$ are required, and to use as a mask layer system with a highly reflecting dielectric layer stack which is stable with respect to high beam energy flows (laser damage threshold). The mask is made of a multi-layer stack, alternatingly with layers of high and low refractive index materials. As the material with high refractive, hafnium oxide, scandium oxide, aluminum oxide or thallium fluoride is suggested. The surface removal on the mask layer stack is said to be realizable through an ion milling process or through glow discharge or through reactive ion etching, whereby, however, the glow discharge (plasma) or reactive ion etching is said to be slower and more difficult in the case of dielectric layers, due to the fact that the high-refraction material tends not to be reactive. Therefore, according to U.S. Pat. No. 4,923,772, the suggested layers of high refractive index material are structured by using ion milling or the lift-off technique.

SUMMARY OF THE INVENTION

It is the aim of the present invention to create a process of the initially stated type which is cost-effective in that a high etching rate and a high selectivity relative to the masking material, such as for example photosensitive resist and/or chromium, are achieved and thus thin resist layers, typically of 500 nm, can also be used for etching dielectric layers or layer stacks having great thicknesses. Further, the thermal load of the masking material, in particular of the photosensitive resist and/or chromium, remains low. Still further, improved control of the step profile is achieved in the sense that essentially vertical side walls are formed.

This is achieved when proceeding according to the method of the present invention.

In contrast to the explanation given in U.S. Pat. No. 4,923,772, it was found that the dielectric layers utilized according to the present invention are exceptionally suitable for reactive etching and are moreover materials which are highly refractive in the UV range. Because of the fact that according to the present invention such dielectric layers can be etched reactively, a thickness patterning process with high selectivity and high etching rate for these materials becomes possible, including the above discussed advantages of reactive etching, and in particular for reactive ion etching, the high controllability of the slope of the side walls.

It is known from U.S. Pat. No. 4,440,841 to reactively etch $TaO_3$, i.e. $TaO_{1.5}$, wherein, however, in spite of the selection of tantalum as Me in the formula $MeO_x$, and $x=1.5$, the selection of x does not result in the low optical absorption of the material which is necessary fore applications in the UV wavelength range $\lambda \leq 308$ nm, namely $k_{308} \leq 0.01$ or even correspondingly $k_{308} \leq 0.003$. For this notation, k refers to the extinction (absorption) coefficient. It should be emphasized here that although the MeO layers which are etched according to the present invention, are specified with their behavior in the UV range, this does not mean that they are only usable in the UV range. For example, due to their chemical resistance, the described and claimed layers or layer stacks are also to be used in other spectral ranges, in particular in the visible range.

In "Fabrication of mosaic color filters by dry-etching dielectric stacks", B. J. Curtis et al., JVac. Sci, Technol. A 4 (1), (1986), p. 70, a reactive etching process is described for $SiO_2/TiO_2$ dielectric layer systems. The mass of Ti is smaller than that of the metals among the dielectric materials according to the present invention, and, moreover, $TiO_2$ cannot be used for UV applications in the above stated spectral range or even for $\lambda \leq 350$ nm.

In a preferred embodiment of the process according to the present invention, the layer is created from $Ta_2O_5$ or from $HfO_2$. Furthermore, for many application purposes, such as for example for the fabrication of masks of the type represented in U.S. Pat. No. 4,684,436, a layer system of the present invention is applied which comprises at least two of the dielectric layers of materials highly refractive in the UV range at wavelengths $\lambda \leq 351$ nm, in particular at wavelengths $\lambda \leq 308$ nm, together with layers of materials having low refractive index in this spectral range, such as for example $SiO_2$ layers.

Furthermore, according to the invention, a gas with a chlorine fraction is used as the gas to be activated, preferably at least comprising $CHClF_2$, or in some cases with He and/or $CHF_3$ and/or $H_2$.

According to another embodiment of the invention, the high refractive index material can also be etched with a combination of the gases stated there.

If, the at least one layer of high refractive index material, i.e. the $MeO_x$ layer, before its removal is at least partially covered with a layer of low refractive index material, in particular $SiO_2$, the extremely advantageous possibility is achieved that the stated high refractive index layer simultaneously acts as an etch stop layer in that the layer of low refractive index material is reactively etched with another gas, essentially without a chlorine fraction, so that the $MeO_x$ layer is not etched at all or only to a negligible extent.

Although activation of the reactive gas according to the invention, can generally take place by means of charged particles, such as by means of electrons and/or ions, such as for example from a Kaufman source, and/or by photons or by laser enhanced means, activation of the gas is preferably carried out in a glow discharge in a vacuum chamber.

Moreover, the gas inlet is preferably cooled so that in, addition to the cooling of the carrier surface for the fabricated structural element, a masking material, for example a resist, is not heated to an impermissible degree, which subsequently makes possible a better detachment of the mask layer from the non-eroded surface regions of the dielectric layer.

In order to interrupt the etching process at the correct point in time, whether the layer system with the at least one dielectric layer has been eroded down to the substrate or if, in a multi-layer system the erosion has been carried out down to a given remaining layer system thickness, all known processes can be used, in particular one or several etch stop layers can be incorporated directly on the substrate or between the layers of the multi-layer system, for example comprising $Al_2O_3$. It has been found according to the invention, however, that an etch stop layer in particular of $Y_2O_3$, is etched at a significantly lower rate than even an $Al_{23}$ layer.

According to other features of the present invention, it has further been found that with the use of a surface of a material doped or provided with alkaline earth ions, a marked orange-colored glow is generated when the reactive ion etching by means of glow discharge reaches this surface. This effect can be exploited very simply as a switch-off criterion for the etching process. A glass used in this Way according to another feature of the invention has a markedly lower etching rate compared to the layer materials, and consequently acts automatically as the etch stop layer. In this way, an impermissible deep etching into the glass substrate is prevented.

Furthermore, for monitoring the progress of the etching process the known reflection processes can also be used. Reference is made to the relevant explanations in U.S. Pat. No. 4,923,772, which in this respect, is incorporated by reference here.

According to another feature of the present invention, it is further suggested to direct at least one light beam from the side of the structural element not exposed to the erosion through its substrate toward the layer and to draw conclusions about the remaining layer thickness from changes of the reflected beam. This has the essential advantage that the homogeneous introduction of a gas does not need to be impaired at the treatment side of the structural element for applying the beam of light and for retrieving the reflected beam. Furthermore, light applying and retrieving openings, potentially with light waveguides, are not exposed to the erosion process in that they are protected by the structural element itself.

An optical element according to another embodiment of the invention is formed as the structural element.

The at least one layer on the structural element absorbs practically no light energy in the UV range with λ=308 nm, so that this structural element is highly suitable for use with UV lasers of high energy. Furthermore, the thickness layers ideally can be vertical to the particular layer surfaces which is realizable through the use of the reactive ion etching process.

An optical imaging system for achieving this forms another embodiment of the present invention.

According to a still further embodiment of the invention a laser source with a beam energy density of more than 100 mJ/cm$^2$, preferably more than 200 mJ/cm$^2$, and even more preferably more than 300 mJ/cm$^2$, is used. This becomes possible due to the layer material MeO$_x$, whereby, due to the precise thickness stepping achieved by the reactive ion etching used according to the invention, the optical imaging system locally modulates the energy of the laser beam very accurately.

A vacuum treatment installation for the fabrication of the above stated structural or optical element, or for carrying out at least the etching step of the above stated fabrication process, forms another embodiment of the invention.

A process for tracking the layer erosion or deposition from or on a structural element for transmitting light in at least one given spectral range is provided according to other features of the invention. A corresponding installation of the invention is also disclosed, according to which the stated tracking takes place through a reflection measurement which is carried out on the side of the structural element facing away from the deposition or erosion process.

The invention also includes a process for determining the point or instant at which the substrate has been reached by reactive ion etching, in which changes in the glow discharge light emission during etching of a surface doped with alkaline earth ions are exploited.

In particular it is therein utilized according to the invention, that a substrate of a glass with alkaline earth ions forms a surface of this type and consequently through the stated light emission detection it is possible to determine rapidly the point in time at which the etching process has locally reached the substrate.

According to other features of the invention, layers with high refractive index such as, in particular, the stated MeO$_x$ layers are etched reactively by means of the one gas, in particular comprising the chlorine fraction. Layers of low refractive index, in contrast, are etched with other gases, such as gases comprising fluorine, in which the high refractive index materials are etched only to a strongly decreased degree. Thus it becomes possible, according to the invention, to etch a low refractive index layer with the stated other gas and to do this until the high refractive index layer has been reached, and still further until a complete homogeneous erosion of the low refractive index layer is reached in the desired area, because the high refractive index layer acts for the other gas used, preferably essentially without chlorine fraction, as an etch stop layer. It is surprising that the high refractive index layers too, and this should be emphasized, are etchable with quite reasonable etching rates, also with fluorine-containing gases, in particular CHF$_3$. Subsequently it is possible, with the introduction of the one gas, i.e. preferably with chlorine fraction, to continue etching of the high refractive index layer. By taking advantage of the stated selectivity, a complete large-area erosion of the low refractive index layer superjacent to the high refractive layer, is achieved.

According to a further embodiment of the invention, an optical element comprises a surface doped with alkaline earth ions, e.g. sodium, with which it becomes possible to detect the point at which the stated layer has been reached by the etching process during its fabrication on the basis of the glow discharge stimulated light emission.

According to a still further feature or embodiment of the invention, the stated surface is formed by a substrate glass comprising alkaline earth ions.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following the invention will be explained in conjunction with drawings wherein.

DESCRIPTION OF THE PREFERRED EMBODIMENTS

Figure 1:
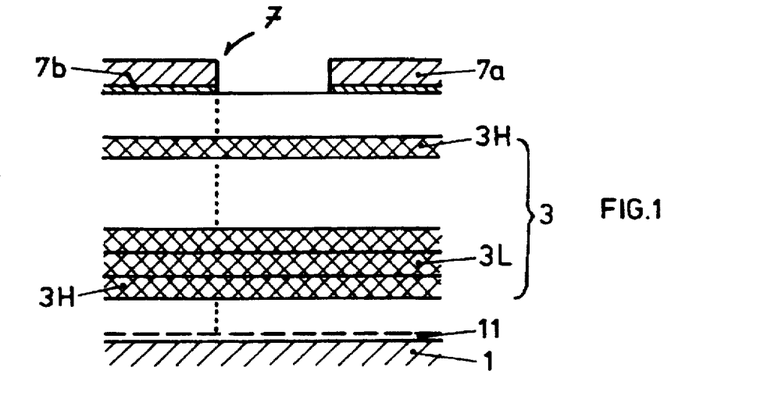
FIG. 1 is a partial sectional schematic view of a layer system to be worked according to the invention with etching mask and etch stop layer on the substrate.

FIG. 1 depicts a layer system 3 on a substrate 1. The layer system 3 comprises at least one high refractive index dielectric layer 3H, but is structured as a layer stack for most applications, with at least one low refractive index layer 3L also. The minimum configuration comprises substrate 1 and high refractive index layer 3H.

According to the invention, the high refractive index layer 3H comprises a dielectric compound MeO$_x$, wherein:

Me is a metal of at least mass 44; and x is selected so that the coefficient of absorption k, i.e. the extinction coefficient, of the layer material for light of λ=308 nm becomes $k_{308} \leq 0.01,$ preferably even $k_{308} \leq 0.003.$ The layer 3H is thus also applicable for UV light wherein the low coefficient of absorption ensures that even at UV wavelengths ≦308 nm, high energies can be transmitted without the damage threshold of the dielectric material being reached.

As the low refractive index layer 3L preferably an $SiO_2$ layer is used or alternatively $Al_2O_3$.

An etching mask 7, formed in known manner is superjacent to the uppermost layer 3H, which can comprise, for example, a photosensitive resist layer 7a and/or a metal layer 7b comprising Cr, Al or also $Fe_2O_3$. The mask 7 is formed in known manner, i.e. developing of the photosensitive resist, etching of the metal layer or the like.

An etch stop layer 11, shown in dashed lines, in particular comprising $Y_2O_3$, is intended to prevent etching of the substrate 1 during etching of exposed regions 3a which are yet. This is due to the selective effect of the reactive etching, according to which only the layer materials forming the layer system 3 are etched. An etch stop layer analogous to layer 11 can be incorporated into the layer system wherever the etching process is to be stopped or interrupted.

Figure 2:
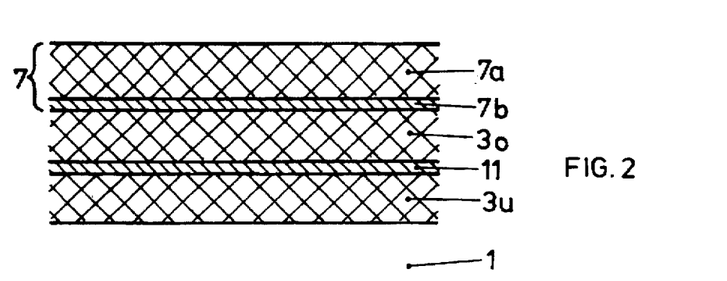
FIG. 2 is a view similar to FIG. 1 of an analogous layer system with embedded etch stop layer, for example in order to etch the layer system so that it is staggered at different depths.

As a high refractive index material of layers 3H, $Ta_2O_5$ or $HfO_2$ are preferred according to the invention. These layer materials are exceptionally suitable for the stated application in the UV light range, but it is understood that they can also be used with light of longer wavelengths. If the dielectric layer stack 3 is not to be eroded down to the substrate 1 through the reactive etching process, between an upper part of the layer system 3o and a lower part 3u, as depicted in FIG. 2, an etch stop layer 11 is inserted, comprising in particular $Y_2O_3$. $Y_2O_3$ is particularly suitable for UV light at high power density, but also for applications in the visible light range. In the case where the dielectric layer stack is to be eroded to different levels, several etch stop layers 11 are used and, as is known, after reaching the first etch stop layer, by reapplying an etching mask, comprising for example a photosensitive resist and its development, regions are formed at the etch stop layer which are free of the reapplied mask layer, for example through corresponding etching or by means of a wet technique whereupon the subjacent dielectric layer stack 3 is continued to be etched until potentially a further etch stop layer has been reached, etc.

Metal layer 7b in FIGS. 1 or 2 can potentially be omitted and the masking can be carried out by means of the photosensitive resist 7a only. Furthermore, after developing the resist layer 7a and etching away of the metal layer 7b, for example comprising chromium, the remaining resist layer can be removed and the remaining metal layer only can be used as the etching mask.

Figure 3:
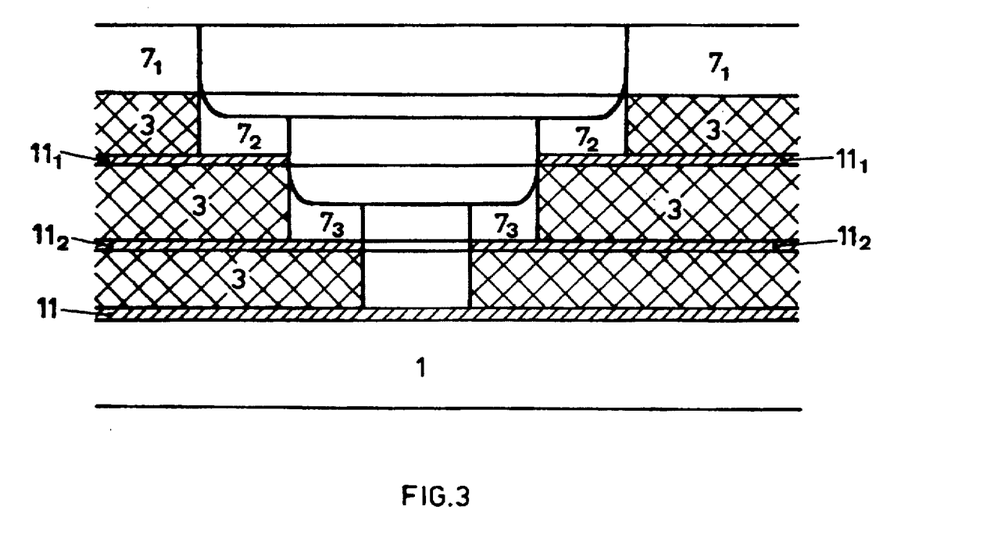
FIG. 3 is a schematic sectional view of an optical element according to the invention, etched to staggered depths, with remaining etching mask parts still to be removed.

FIG. 3 depicts, by example, an optical element according to the invention, on which the dielectric layer system 3 has been eroded locally to two levels. The photosensitive resist $7_1$ to $7_3$ as well as the etch stop layers $11_1$ and $11_2$ are the last layers yet to be removed. An optical element according to the invention comprises as its minimum structure a substrate or carrier 1 as well as a layer 3H according to FIG. 1 and can be built up further with additional layers in known manner.

Due to the low absorption of the high refractive index material used according to the invention, in particular $Ta_2O_5$ or $HfO_2$, optical elements of the invention are realizable with highly precise structuring edges which are highly suitable to be used together with UV lasers, excimer lasers of high energy, such as for example for the laser ablation technique in material working, in particular in semiconductor production. In that field energy densities of more than 100 $mJ/cm^2$, preferably more than 200 $mJ/cm^2$ or even more than 300 $mJ/cm^2$, are applied.

Figure 4:
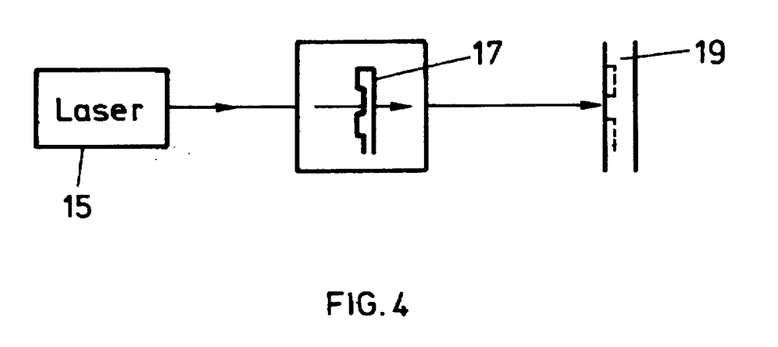
FIG. 4 is a schematic diagram of an optical imaging system according to the invention.

An optical imaging system according to the invention is depicted schematically in FIG. 4 and comprises an excimer laser light source 15, and an optical element 17 according to the invention, used as a mask in such a way that the pattern of the mask is transferred to a work piece 19 to be structured through laser ablation due to the mask-dependent locally varying laser energy transmission.

Figure 5:
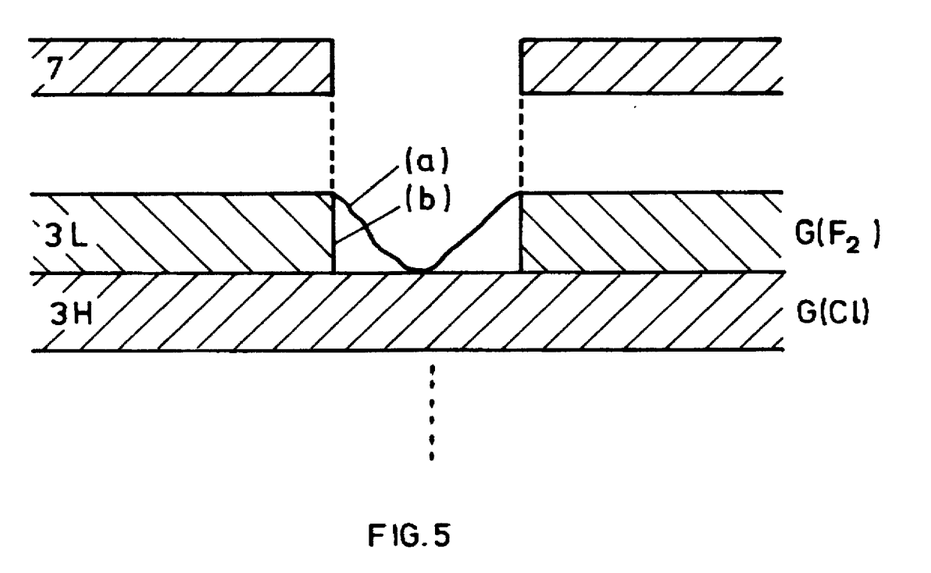
FIG. 5 is a schematic sectional view of a layer system fabricated according to the invention in which one of the MeO$_x$ layers itself is used as an etch stop layer.

FIG. 5 illustrates a layer system with an etching mask 7, below which is a layer 3L of low refractive index material and a further layer 3H of high refractive index material. The layer 3H comprises the specific material $MeO_x$. The layer of low refractive index material, in turn, preferably comprises $SiO_2$ or alternatively, $Al_2O_3$. The schematically depicted etching profile (a) represents the etching of layer 3L according to mask 7. This reactive etching takes place with a reactive gas G which preferably at least essentially does not comprise chlorine but rather fluorine. By means of the one reactive gas the layer 3H cannot be etched at all or only insignificantly. Consequently, this layer acts as the etch stop layer for the etching process of layer 3L.

In the case of a reactive etching process, etching continues, in spite of the fact that the surface of layer 3H with the preferably fluorine-containing reactive gas has been reached, until the layer 3L corresponding to mask 7 has been completely etched away from the surface of layer 3H. The working process can now be completed if there is no intention of etching the layer 3H also or the reactive gas is being changed in that now a different, preferably chlorine-containing gas is used, as is schematically indicated by G(Cl). The other process parameters can potentially also be changed.

Figure 6:
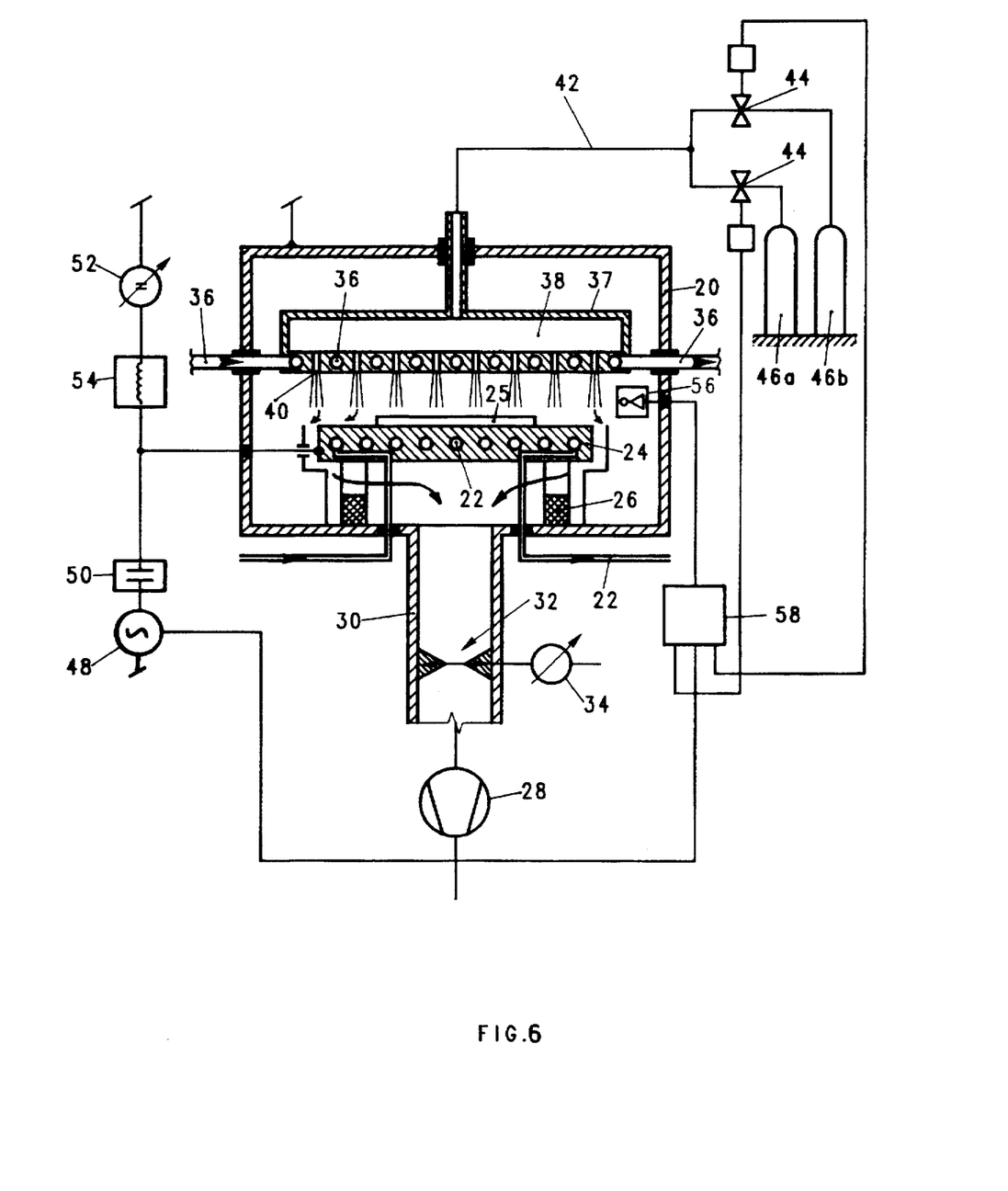
FIG. 6 is a schematic sectional view of a vacuum treatment installation according to the invention.

FIG. 6 schematically illustrates a vacuum treatment installation according to the invention, laid out for performing the etching process to be completed within the scope of the process according to the invention. As has been stated, the structuring can in principle be carried out with different reactive etching processes within the scope of the invention. Preferably, however, reactive ion etching with the aid of a glow discharge is used. For this purpose the installation according to FIG. 6 comprises in a vacuum recipient 20 a work piece carrier electrode 24, which is water-cooled via a line system 22. The work piece carrier electrode 24 for a work piece 25 is mounted so as to be electrically insulated with respect to the walls of the recipient 20, as is depicted schematically by insulation 26. Centrally under the work piece carrier electrode 24 is disposed a suction port 30 connected to a turbomolecular pump 28, whose pump cross section can be adjusted by means of an iris diaphragm 32 and via an adjustment unit 34 for the iris.

Opposing the work piece carrier electrode 24 is a counterelectrode 37 which is preferably water-cooled via a line system 36. On its face opposing the work piece 25 are provided regularly distributed gas outlet openings 40 which communicate with a gas distribution system 38 and a gas feed line 42. The latter is connected via throughflow regulation valves 44 with one or several gas tanks 46a and/or 46b. With the setting valves 44 the particular throughflow quantity or the reactive gas composition is set or regulated. For reasons of cleanliness it is quite possible to implement the installation vertically or with the work piece carrier electrode above.

As has been stated, the layers of high refractive index in the layer stack according to FIGS. 1 to 3 are preferably etched with a chlorine-containing gas as the reactive gas. Consequently, the tank 46a, contain a chlorine-containing gas, preferably $CHClF_2$, possibly additionally He or $CHF_3$ or $H_2$. This tank 46a can, moreover, contain a combination comprising the gases $Cl_2$, $H_2$, $F_2$ and $CF_4$, which gas mixture can also be supplied to the treatment chamber after being mixed from several gas tanks. The low refractive index layers, in particular of $SiO_2$, on the layer stack according to FIGS. 1 to 3 are also etchable by means of a reactive gas which essentially does not comprise any chlorine but rather, for example and preferably comprises fluorine, preferably fluorine gas.

Consequently, the second gas tank 46b according to FIG. 6 preferably contains the other gas which is not chlorine-containing but rather is a fluorine-containing gas. As will be explained in connection with FIG. 5, a layer of low refractive index material can be etched with the fluorine-containing gas from tank 46b, and after its etching-off down to the next lower high refractive index layer, the latter can subsequently be etched by supplying another, preferably chlorine-containing gas into a process volume P in the vacuum chamber 20.

In the case of the depicted example the work piece carrier electrode 24 is fed by means of an RF generator 48 via a matching network 50, relative to ground, to which is also connected, for example the chamber wall 20. In order to bias the work piece carrier electrode via a decoupling network 54, a settable DC value from a DC voltage source 52 can be added to the RF signal.

The electrical connection can, of course, also be carried out differently in known manner in that the AC signal is applied between work piece carrier electrode 24 and electrode 37 and the chamber wall 20 is placed independently of the electrode potentials, at a floating potential or at a reference potential. Independently of this, the work piece carrier electrode can still be connected to a DC bias voltage.

As has been explained, in the reactive etching process used according to the invention, it is an essential purpose is to detect at what moment the erosion of the layer stack on the substrate 1 according to FIGS. 1 to 3, reaches a given degree. To this end, as schematically depicted in FIG. 6, a detector unit 56 is provided which detects, in a manner to be described, when a given erosion depth has been reached and intervenes via an evaluation unit 58 in a controlling manner in the etching process. This intervention may occur, as depicted, in the RF generator 48 and/or the throughflow setting valves or elements 44 for the reactive gas or the reactive gases.

In particular it is therewith possible after etching of the low refractive index layers with the one gas, preferably with the gas not containing chlorine but rather preferably the fluorine-containing gas from the tank 46b, to change the reactive gas, preferably by introducing at least a chlorine fraction or the stated chlorine-containing gas and, as was explained with FIG. 5, to etch the high refractive index layer of $MeO_x$. In general, the results of the present invention so that with good probability of success, the stated are achieved through the suitable selection of the $Cl_2$ or F content as well as possible additional gas fractions.

If, as has been described in conjunction with FIGS. 1 to 3, etch stop layers 11 are provided in the reactive ion-etched layer stack according to the invention, the detector unit 56 detects for example changes in process radiation. In this connection it was found that if a glass with alkaline earth ions is used as the substrate material, when the etching process has reached the substrate, light is generated with a significant spectral component, namely orange light, so that when using a substrate of this type the substrate can be used simultaneously as an etch stop layer, the point when the substrate is reached being readily detected.

Generally and furthermore, surfaces can be provided on the layer system which are doped with alkaline earth ions in order to detect in the stated manner, in conjunction with the glow discharge light spectrum which changes significantly, the moment when this surface is reached by the etching process. It is understood that the doping of the stated surface with alkaline earth ions takes place as a function of whether or not such a doping can be tolerated for the later application of the structural element which is fabricated according to the invention. For example, an alkaline earth ion doping, whether of the substrate, such as the substrate glass, or of a stack layer, in particular of a low refractive index layer, such as an $SiO_2$ layer, can lead to the result that the finished optical element is no longer optimally suitable for UV. But since, as has been stated already, the optical elements with the $MeO_x$ layer worked according to the invention are not only suitable for UV use only but rather can also be quite advantageously used in the visible light range also, the stated doping in many cases will not degrade the required optical characteristics.

It is noted that the stated $MeO_x$ materials, in particular $HfO_2$, are chemically extraordinarily stable and, produced for example through ion plating, have an extremely low scattered-light component so that the use of these layers is often highly advantageous even with these optical elements being used in the visible light range.

When using a substrate material comprising glass with alkaline earth ions, for example sodium ions, it was further found that the etching rate of this substrate is significantly lower than that of the dielectric layers $MeO_x$ used according to the invention or the preferably used low refractive index layers, such as for example of $SiO_2$ or possible $Al_2O_3$, so that additionally, when applying a substrate material of this type, it is ensured, that the substrate surface before interruption of the etching process when detecting the characterizing glow discharge light spectral component, is etched only to a small degree.

For monitoring the etching process with respect to the remaining layer or layer stack thickness, other known processes can also be used such as for example known reflection measurement of a laser beam which is guided, for example, through the electrode 37 onto the etched structural element and whose reflection is evaluated.

Moreover, methods such as plasma emission spectroscopy or mass spectroscopy of the pumped-off gases can be used for process control.

Figure 7A:
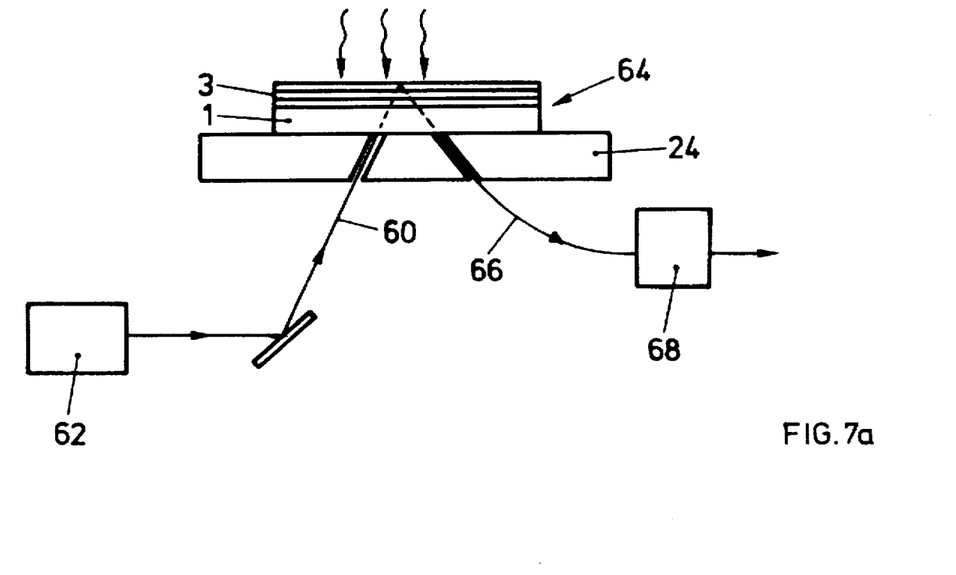
FIG. 7a is a schematic view of an etching depth or layer thickness detection system according to the invention per se, and used preferably in the installation according to FIG. 6.
Figure 7B:
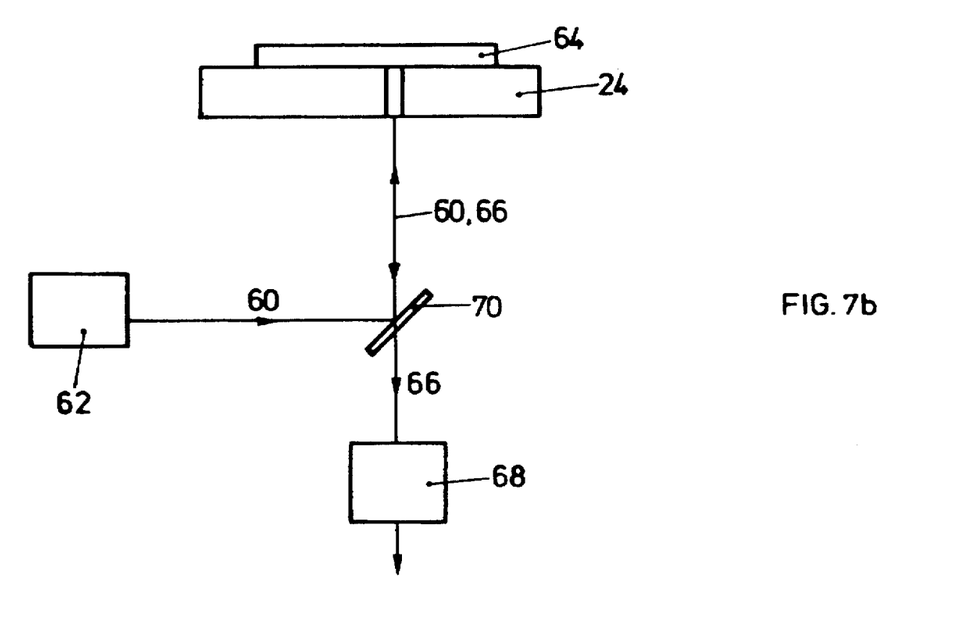
FIG. 7b is a schematic view of the system according to FIG. 7a, in which sent and reflected light beams are guided in a work piece carrier electrode through the same light waveguide channel.

A preferred procedure for process guidance is depicted schematically in FIGS. 7a and 7b, based on the representation of FIG. 6. This procedure or a correspondingly designed vacuum treatment installation are viewed as being inventive by themselves and also isolated from the complex for etching dielectric layers. With respect to FIG. 6, the beam 60 of a light source shown in FIG. 7a, preferably a laser light source 62, is transmitted through the work piece carrier electrode 24 and directed onto the structural element 64 which itself is transmitting in the spectral range of the light beam 60. The surface of the structural element is subjected to the erosion process or is more generally being worked, e.g. is being coated. The beam 66 reflected by the structural element 64 or the beams 66 reflected by the several layers are supplied for example via light waveguides to an evaluation unit 68. Changes of the beam reflection on the structural element 64 are evaluated as a measure of which of the layers have been eroded up to that moment through the etching process, or which layer thickness has been deposited up to then, for example by means of a plasma-enhanced CVD process.

As depicted in FIG. 7b, this technique can also be implemented so that by means of a semipermeable mirror element 70 the reflected beam 66 is supplied to the evaluation unit 68 which acts upon the reactive gas setting elements and/or the RF generator (e.g. 13.56 MHz) 48 according to FIG. 6, within the scope of the etching process according to the invention. It must be emphasized that, depending on the etching process performed, upon reaching a given etching depth at which a changed layer material is encountered, this, after detection at the unit 68, may also be used for changing the reactive gas mixture, as has been stated, and that by this inventions it appears probable, for a change from the chlorine-containing to the fluorine-containing gas and conversely, or for a change between other gases.

In the following examples of the process according to the invention will be represented as well as structural elements according to the invention.

In the examples the following notation is used:

L: layer of low refractive index material,

H: layer of high refractive index material, optical thickness=(index of refraction)*(physical thickness x), and x: physical thickness.

The diameter of the work piece carrier electrode 24 according to FIG. 5 is 25 cm, the distance d between work piece carrier electrode and counter electrode 37 is specified in each instance under the etching parameters. The following are examples of stacks of layers made with the process of the present invention.

EXAMPLE 1

$Ta_2O_5/SiO_2$ Stack mirror, centered for 308 nm:

| Sequence | Material | Physical thickness x | |
|---|---|---|---|
| Substrate | | | |
| $L_1$ | $SiO_2$ | 106 nm | |
| $H_1$ | $Ta_2O_5$ | 30 nm | |
| $L_2$ | $SiO_2$ | 91 nm | |
| $H_2$ | $Ta_2O_5$ | 30 nm | |
| L | $SiO_2$ | 53 nm | } 4 × |
| H | $Ta_2O_5$ | 33 nm | |
| $L_3$ | $SiO_2$ | 106 nm | |

Structure: $L_1H_1L_2H_2(LH)^4L_3$
Total thickness, physical: 707 nm
Etching parameters:
 Reactive gas: $CHClF_2$, He
 Gas flow: $CHClF_2$: 50 sccm
  He: 50 sccm
 Gas pressure: $p=1.8\times10^{-3}$ mbars
 RF power: 300 W
 Frequency: 13.56 MHz
 Electrode distance: d=5 cm
 Etching time to substrate: $\tau=657$ seconds
 Average etching rate: 1.08 nm/sec
 Externally applied DC bias: 0 V
 Note: Including etching of Cr mask

EXAMPLE 2

$HfO_2/SiO_2$ Stack mirror centered for 248 nm:

| Sequence | Material | Physical thickness x | |
|---|---|---|---|
| Substrate | | | |
| $L_1$ | $SiO_2$ | 83 nm | |
| $H_1$ | $HfO_2$ | 29 nm | |
| L | $SiO_2$ | 42 nm | } 7 × |
| H | $HfO_2$ | 29 nm | |

Air Structure: $L_1H_1(LH)_7$
Total thickness, physical: 609 nm
Etching parameters:
 Reactive gas: $CHClF_2$
 Gas flow: 50 sccm
 Gas pressure: $p=7\times10^{-3}$ mbars
 RF power: 300 W (13.56 MHz)
 Electrode distance: d=5 cm
 Etching time: $\tau=1098$ seconds
 Etching rate: 0.555 nm/seconds
 Externally applied DC bias: 0 V with 1 μm AZ 1350 photosensitive resist mask

EXAMPLE 3

Single layer $Ta_2O_5$
Etching parameters:
 Reactive gas: $CHClF_2$
 Gas flow: 50 sccm
 Gas pressure: $p=1.2\times10^{-2}$ mbars
 RF power: 500 W (13.56 MHz)
 Externally applied DC bias: 0 V
 Electrode distance: d=5 cm
 Etching rate: 0.95 nm/seconds

EXAMPLE 4

Single layer $HfO_2$
Etching parameters:
 Reactive gas: $CHClF_2$
 Gas flow: 50 sccm
 Gas pressure: $1.1\times10^{-2}$ mbars
 RF power: 300 W (13.56 MHz)
 Externally applied DC bias: 0 V
 Electrode distance: d=5 cm
 Etching rate: 0.39 nm/seconds

EXAMPLE 5

Single layer $Y_2O_3$ (as etch stop layer!)
Etching parameters:
 Reactive gas: $CHClF_2$, He
 Gas flows: $CHClF_2$: 50 sccm
  He: 69 sccm
 Pressure: $1.2*10^{-2}$ mbars
 RF power: 300 W (13.56 MHz)
 Externally applied DC bias: −80 V
 Electrode distance: d=5 cm
 Etching rate: 0.06 nm/seconds

EXAMPLE 6

Single layer, as low-refraction layer in stack: $Al_2O_3$
Etching parameters:
 Reactive gas: $CHClF_2$, He
 Gas flows: $CHClF_2$: 50 sccm
  He: 69 sccm
 Pressure: $1.2*10^{-2}$ mbars
 RF power: 500 W (13.56 MHz)
 Externally applied DC bias: −97 V
 Electrode distance: d=5 cm
 Etching rate: 0.41 nm/seconds It must be emphasized that instead of the preferred reactive ion etching by means of glow discharge, in principle other reactive etching processes, such as for example "chemically assisted ion beam etching" are also suitable. Therein argon ions from a Kaufman ion source bombard the structural element to be fabricated thereby spraying a reactive gas, preferably $CHClF_2$, onto the surface of the element.

Furthermore, with the same arrangement according to FIG. 6, as has already been stated, the L layers, in particular comprising $SiO_2$, can be etched with a different gas, for example with $SF_6$, i.e. with a gas without chlorine fraction, wherein subsequently the H layers act as etch stop layers.

While specific embodiments of the invention have been shown and described in detail to illustrate the application of the principles of the invention, it will be understood that the invention may be embodied otherwise without departing from such principles.

What is claimed is:

1. Process for controlling a reactive etching process of a stack of layers with at least one first layer of high refractive index material and, above it, a second layer of low refractive index material, the first layer being MeO$_x$ Me being a metal whose atomic mass is at least 44, x being selected so that the coefficient of absorption k of the layer material at light of wavelength $\lambda$=308 nm is $k_{308} \leq 0.01$, the second layer being SiO$_2$, the process comprising: etching the second layer using a gas without a chlorine fraction, the point at which the surface of the first layer is reached being detected and subsequent using another gas which has a chlorine fraction, for further etching.

2. Process according to claim 1, wherein the stack being etched in a stepped manner for the formation of an at least one step in thickness.

3. Process according to claim 1, wherein x is selected so that $k_{308} \leq 0.003$.

4. Process according to claim 1, wherein Me is Ta and x is 2.5, the dielectric layer being applied being Ta$_2$O$_5$.

5. Process according to claim 1, wherein Me is Hf and x is 2, the dielectric layer being applied being HfO$_2$.

6. Process according to claim 1, wherein said other gas comprises a combination of Cl$_2$ with at least one of further gases H$_2$, F$_2$, CF$_4$, SF$_6$.

7. Process of claim 1, including homogeneously distributing said gas and said another gas over a surface region to be etched, thereby distributing said gas and said other gas substantially vertically onto said surface region.

8. Process of claim 1, including activating at least one of said gas and said other gas, using at least one of charges particles selected from the group consisting of electrons and ions.

9. Process of claim 1, including enhancing at least one of said etching and of said further etching by photons.

10. Process of claim 1, including providing a carrier electrode to carry the stack of layers, and a counter-electrode spaced from the carrier electrode, and maintaining a glow discharge between the electrode in a direction of discharge for acitivating at least one of said gas and said another gas and supplying said at least one of said gas and said another gas using a nozzle for directing gas substantially in the direction of the discharge.

11. Process of claim 1, including supplying at least one of said gas and said another gas through a gas inlet and cooling said gas inlet.

12. Process of claim 1, further providing said low refractive index material as a doped material.

13. Process of claim 12, further comprising the step of detecting the moment when said first layer is reached by said reactive etching process by detecting a change of emitted light radiation.

14. Process of claim 13, wherein the other layer is doped with alkaline earth ions.

15. Process of claim 1, wherein said stack of layers with at least two layers is deposited on a glass substrate containing alkaline earth ions.

16. Process of claim 1, including directing at least one light beam with a spectral range in which said stack of layers is transmitting onto and through one side of said stack which is not being etched, to an opposite side of said stack which is being etched, and monitoring refracted light of said beam as an indication of etch depths.

17. Process according to claim 1, wherein
Me=Y and
x=1.5
and consequently the layer is Y$_2$O$_3$.

18. Process of claim 1, including using for etching said first layer, a fluorine containing gas.

19. Process according to claim 1, wherein the other gas comprises CHClF$_2$.

20. Process according to claim 19, wherein the other gas includes at least one of He, CHF$_3$ and H$_2$.

21. A process for fabrication of a mask for UV-laser ablation in a semiconductor technique, comprising the steps of:

applying a dielectric layer of HfO$_2$ onto a base of a substrate, so that the coefficient of absorption k of said dielectric layer material at light with a wave-length $\lambda$=308 nm is $k_{308} \leq 0.01$ and mask patterning said dielectric layer by reactive plasma etching.

22. Process according to claim 21, wherein $k_{308} \leq 0.003$.

23. Process according to claim 21, wherein a gas which is activated for the etching comprises CHClF$_2$.

24. Process according to claim 23, wherein the gas to be activated further includes at least one of He, CHF$_3$ and H$_2$.

25. Process according to claim 21, wherein a gas to be activated for the etching comprises a combination of Cl$_2$ with at least one of the further gases H$_2$, F$_2$, CF$_4$, and SF$_6$.

26. Process according to claim 21, including, before the etching step, covering the dielectric layer at least partially with a layer of low refractive index material as compared to the dielectric layer, and reactively etching the layer of low refractive index with an activated gas which is essentially without a chlorine fraction and which has a fluorine fraction which etches the HfO$_2$ layer at a substantially reduced rate.

27. Process according to claim 21, wherein a further layer is disposed on said dielectric layer and wherein said further layer is reactively etched with a gas which is essentially free of a Cl$_2$ fraction in such a way that said dielectric layer acts as an etch stop layer for said etching of said further layer.

28. Process according to claim 21, including homogeneously distributing a gas during the etching using a nozzle over a surface region to be etched, the gas being distributed substantially vertically onto the surface region, a density of reactive gas species in the gas being selected to be substantially homogeneous near the surface region.

29. Process according to claim 21, including activating a gas during the etching using at least one of the charged particles selected from the group consisting of electrons and ions.

30. Process according to claim 21, including enhancing the etching step using photons.

31. Process according to claim 21, including providing a carrier electrode and a counter-electrode spaced from the carrier electrode, maintaining a glow discharge between the carrier electrode and the counter-electrode for activating a gas, and supply the gas to the dielectric layer using a nozzle for directing the gas substantially in the direction of the discharge.

32. Process according to claim 21, including supplying a gas during the etching through a gas inlet and cooling the gas inlet.

33. Process according to claim 21, wherein at least one other layer made of low reflective index material, is applied under said dielectric layer so that at a moment when the other layer is reached by the etching, a change of emitted light radiation occurs which can be detect.

34. Process according to claim 33, wherein the other layer is doped with alkaline earth ions.

35. Process according to claim 21, wherein the substrate comprises glass containing alkaline earth ions which generates emitted light radiation detectably different from emitted light of said dielectric layer when exposed to a reactive glow discharge-enhanced etching process the etching including activating a gas using a reactive glow discharge.

36. Process according to claim 21, further comprising directing at least one light beam with a spectral range in which the dielectric layer is light-transmitting, onto and through one side of the dielectric layer, which is not reactively etched to an opposite side of the dielectric layer, which is being reactively etched, and evaluating etching depths from monitoring refracted light of said light beam, and drawing conclusions about a remaining coating thickness of material on the opposite side of the structural element from changes in the reflected light.

37. Process according claim 21, including using for the etching of the $HfO_2$ layer a fluorine-containing gas.

* * * * *